United States Patent
Wang

[19]

[11] Patent Number: 5,940,750
[45] Date of Patent: Aug. 17, 1999

[54] LOW-COST LOW NOISE BLOCK DOWN-CONVERTER WITH A SELF-OSCILLATING MIXER FOR SATELLITE BROADCAST RECEIVERS

[76] Inventor: Guan-Wu Wang, 1544 N. Port Rd., Decatur, Ill. 62526

[21] Appl. No.: 08/922,402

[22] Filed: Sep. 3, 1997

Related U.S. Application Data

[63] Continuation of application No. 08/757,071, Nov. 26, 1996, abandoned, which is a continuation of application No. 08/245,598, May 18, 1994, abandoned.

[51] Int. Cl.⁶ .................................................. H04B 1/26
[52] U.S. Cl. ........................................ 455/318; 455/333
[58] Field of Search ...................................... 455/313, 316, 455/318, 323, 333, 3.2, 3.3, 241.1, 253.2

[56] References Cited

U.S. PATENT DOCUMENTS

| | | | |
|---|---|---|---|
| 3,949,306 | 4/1976 | Watanabe et al. | 455/333 |
| 4,160,953 | 7/1979 | Matsuura et al. | 455/333 |
| 4,219,779 | 8/1980 | Shinkawa et al. | 455/321 |
| 4,498,061 | 2/1985 | Mörz et al. | 343/756 |
| 4,584,716 | 4/1986 | Drentea | 455/323 |
| 4,595,890 | 6/1986 | Cloutier | 343/786 |
| 4,596,045 | 6/1986 | Maier | 455/140 |
| 4,605,909 | 8/1986 | Tsironis | 455/325 |
| 4,608,710 | 8/1986 | Sugiura | 455/316 |
| 4,688,005 | 8/1987 | Kipnis | 455/318 |
| 4,792,987 | 12/1988 | Tumeo | 455/323 |
| 5,005,023 | 4/1991 | Harris | 343/756 |
| 5,119,509 | 6/1992 | Kang | 455/328 |
| 5,125,109 | 6/1992 | Geller et al. | 455/313 |
| 5,224,218 | 6/1993 | Shiga | 455/323 |
| 5,263,182 | 11/1993 | Park | 4155/3.2 |
| 5,323,064 | 6/1994 | Bacon et al. | 455/333 |
| 5,345,591 | 9/1994 | Tsurumaki et al. | 455/3.2 |
| 5,428,837 | 6/1995 | Bayruns et al. | 455/333 |

FOREIGN PATENT DOCUMENTS 0 555 689 A2  1/1993  European Pat. Off. .
2 235 585  11/1983  United Kingdom .

OTHER PUBLICATIONS

K. Imai and H. Nakakita, "A 22–GHz–Band Low Noise Downconverter for Satellite Broadcast Receivers," IEEE Trans. MTT, vol. 39, pp. 993–999, Jun. 1991.

Y. Tajima, "GaAs FET Applications for Injection–Locked Oscillators and Self–Oscillating Mixers," Proc. MTT–S, Ottawa, 1978, pp. 303–305.

R.A. Pucel and D. Masse, "Performance of GaAs MESFET Mixers at X Band," IEEE Trans. MTT, vol. 24, pp. 351–360, Jun. 1976.

C. Rauscher, "Large–Signal Technique for Designing Single–Frequency and Voltage–Controlled GaAs FET Oscillators," IEEE Trans. MTT, vol. 29 pp. 293–304, Apr. 1981.

K.L. Kotzebue, "A Technique for the Desing of Microwave Transistor Oscillators," IEEE Trans. MTT, vol. 32, pp. 719–721, Jul. 1984.

G.W. Wang, I. Ichitsubo, W.H.Ku, Y.K. Chen and L.F. Eastman, "Large–Signal Time–Domain Simulation of HEMT Mixers," IEEE Trans. MTT, vol. 36, No. 4, pp. 224–226, Apr. 1988.

C. Tsironis, R. Stahlmann and F. Ponsc, "A Self–Oscillating Dual Gate MESFET X–Band Mixer with 12 dB Conversion Gain," Conf. Proc. 9th European Microwave Conference, 1979, pp. 371–375.

Primary Examiner—Reinhard J. Eisenzopf
Assistant Examiner—Marsha D. Banks-Harold
Attorney, Agent, or Firm—Fried, Frank, Harris, Shriver & Jacobson

[57] ABSTRACT

A low-cost low noise block down-converter for use in a receiver in a satellite broadcasting system is provided. The down-converter includes a high-performance self-oscillating mixer made from a MESFET with a dielectric resonator for providing feedback. The self-oscillating mixer functions as both an oscillator and a mixer and, thus, reduces the cost and number of components to manufacture the down-converter.

46 Claims, 7 Drawing Sheets

LOW-COST LOW NOISE BLOCK DOWN-CONVERTER WITH A SELF-OSCILLATING MIXER FOR SATELLITE BROADCAST RECEIVERS

This is a continuation, of application Ser. No. 08/757,071, filed Nov. 26, 1996, now abandoned, entitled Low-Cost Low Noise Block Down-Converter With A Self-Oscillating Mixer For Satellite Broadcast Receivers, which is a continuation, of application Ser. No. 08/245,598, filed May 18, 1994, now abandoned, entitled Low-Cost Low Noise Block Down-Converter With A Self-Oscillating Mixer For Satellite Broadcast Receivers.

BACKGROUND OF THE INVENTION

This invention relates to a low noise block down-converter for satellite broadcast receivers and, more particularly, a low-cost, low noise block down-converter having a self-oscillating mixer for use in direct-to-home satellite receivers.

In the past few years the demand for more diversified satellite services has continued to grow. For example, there has been widespread recent interest in new media services such as integrated services of digital broadcasting (ISDB) and digital high-definition TV (HDTV). Among the various types of satellite communication systems for distributing these and the more conventional satellite services, direct broadcasting satellite (DBS) has become a major system. For example, as of the end of 1993, the broadcasting satellite system ASTRA 1A, 1B and 1C has reached over forty-five million homes across Europe. Over ten million of those homes own direct-to-home (DTH) satellite receiver equipment. Moreover, in Asia, North and South America, DTH satellite broadcasting is also emerging as a strong contender for market share presently possessed by the more conventional "cable" TV service.

In DBS, the low noise block (LNB) down-converter that amplifies and converts the extremely weak microwave signals down to UHF signals is generally considered one of the most critical components in the satellite receiver system. Because of recent advances in III–V compound semiconductor electronics, especially the development and commercialization of high electron mobility transistors (HEMTs), it is now possible to make high-quality, low noise block down-converters available to the mass market. However, there is still a need for improving the manufacturing yield and reliability of such down-converters, as well as reducing their cost. In particular, there is a need for reducing the number of components in the LNB down-converter in order to provide high performance at low cost.

In light of the above, it would be desirable to be able to provide a low noise block down-converter with improved manufacturing yield and reliability for use in a receiver in a satellite broadcasting system.

It would also be desirable to be able to provide a low noise block down-converter for use in a receiver in a satellite broadcasting system that can be manufactured at lower cost.

It would further be desirable to be able to provide a low noise block down-converter for use in a receiver in a satellite broadcasting system that can provide high performance for low cost.

SUMMARY OF THE INVENTION

It is an object of this invention to provide a low noise block down-converter with improved manufacturing yield and reliability for use in a receiver in a satellite broadcasting system.

It is also an object of this invention to provide a low noise block down-converter for use in a receiver in a satellite broadcasting system that can be manufactured at lower cost.

It is a further object of this invention to provide a low noise block down-converter for use in a receiver in a satellite broadcasting system that can provide high performance for low cost.

In accordance with the present invention there is provided a low noise block down-converter for use in a receiver in a satellite broadcasting system. The low noise block down-converter includes: (1) a low noise amplifier having an input adapted for coupling to a satellite reflector dish and having an output for providing an amplified RF signal; and (2) a self-oscillating mixer having an input coupled to the amplified RF signal and having an output for providing an intermediate frequency signal corresponding to the RF signal, wherein the self-oscillating mixer functions as both an oscillator and a mixer. The down-converter converts the RF signal to the intermediate frequency signal at a lower frequency.

The present invention also includes a method for manufacturing a low noise block down-converter for use in a receiver in a satellite broadcasting system. The method includes the steps of: (a) providing an RF amplifier for amplifying an RF satellite signal; (b) coupling a self-oscillating mixer to the RF amplifier for down-converting the RF satellite signal to an intermediate frequency, wherein the self-oscillating mixer functions as both an oscillator and mixer; and (c) providing an intermediate frequency amplifier for amplifying the intermediate frequency signal. The down-converter converts the RF signal to the intermediate frequency signal at a lower frequency.

BRIEF DESCRIPTION OF THE DRAWINGS

The above and other objects and advantages of the invention will be apparent upon consideration of the following detailed description, taken in conjunction with the accompanying drawings, in which like-reference numerals refer to like-parts throughout, and in which.

DETAILED DESCRIPTION OF THE INVENTION

Figure 1:
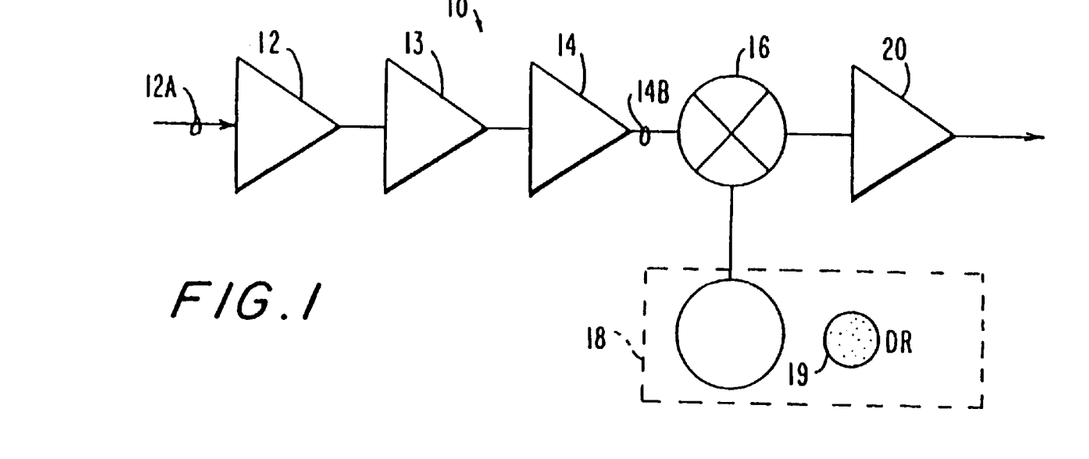
FIG. 1 is a schematic block diagram of a prior art low noise block down-converter.

FIG. 1 is a schematic block diagram of a prior art low-noise block down-converter 10. Down-converter 10 includes low-noise amplifiers 12, 13 and 14, mixer 16, oscillator 18 and IF amplifier 20. Down-converter 10 works as follows. Input 12A of amplifier 12 is coupled to a super high frequency RF signal (e.g., 12 GHz or 22 GHz) from a feedhorn mounted at the focal point of a reflector dish (not shown). The RF signal at input 12A is amplified by cascaded amplifiers 12, 13 and 14. The amplified RF signal at output 14B of amplifier 14 is then mixed with an oscillating signal from external and independent oscillator 18 at mixer 16 to produce a modulated intermediate frequency (IF) signal (e.g.,900 to 2,500 MHz or 1.1 to 1.6 GHz for 12 GHz and 22 GHz RF signals, respectively) at output 16B of mixer 16. Oscillator 18 includes high-Q dielectric resonator (DR) 19 for stabilization. The mixed IF signal is then amplified by IF amplifier 20 to provide an amplified IF signal for coupling to, for example, a receiver/demodulator (not shown).

In order to provide acceptable gain and noise characteristics for DBS applications at 10–12 GHz, down-converter 10 typically includes three amplifiers 12, 13 and 14 employing GaAs-based high electron mobility transistors (HEMTs) or metal-semiconductor field effect transistors (MESFETs). In particular, DBS applications typically require 50 dB of conversion gain (at least) and 1.5 dB of noise figure (at most) over the RF frequency range (e.g., 10 to 12 GHz).

Figure 2:
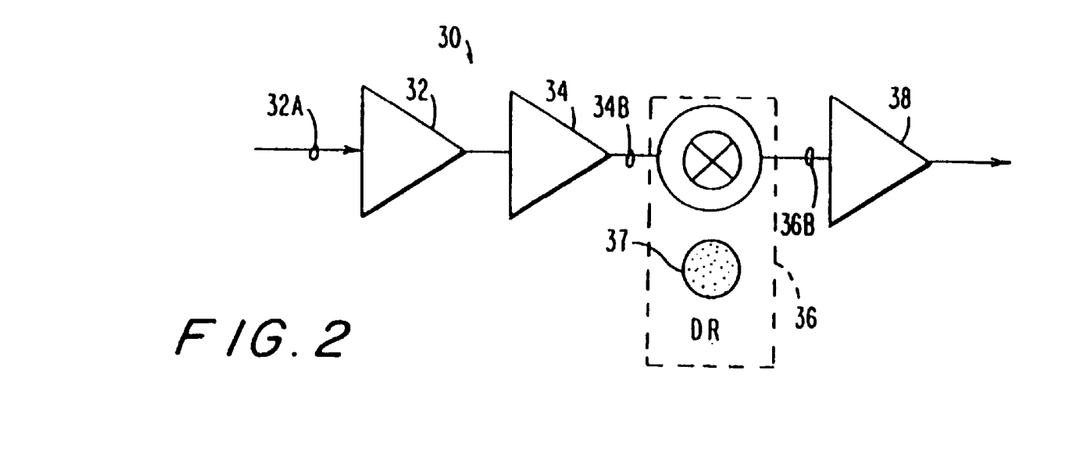
FIG. 2 a schematic block diagram of a low-noise block down-converter in accordance with the present invention.

FIG. 2 is a schematic block diagram of a low-noise block down-converter 30 in accordance with the present invention. Down-converter 30 includes low-noise amplifiers 32 and 34, self-oscillating mixer 36 and IF amplifier 38. In comparison to down-converter 10 of FIG. 1, down-converter 30 includes one less low-noise amplifier (12, 14 or 16) and does not include an independent oscillator similar to oscillator 18. However, down-converter 30 still provides acceptable conversion gain and noise figure characteristics, as discussed below.

Down-converter 30 works as follows. Input 32A of amplifier 32 is coupled to the super high frequency RF signal. The RF signal at input 32A is amplified by cascaded amplifiers 32 and 34. The amplified RF signal at output 34B of amplifier 34 is then coupled to self-oscillating mixer 36 to produce the modulated intermediate frequency (IF) signal at output 36B of mixer 36. Self-oscillating mixer 36 includes high-Q dielectric resonator (DR) 37 for stabilization. The IF signal is then amplified by IF amplifier 38 to provide an amplified IF signal for coupling to, for example, a receiver/demodulator (not shown) as described above.

In accordance with the present invention, because mixer 36 provides conversion gain (instead of conversion loss as in FIG. 1), the down-converter of the present invention eliminates the need for a third stage of low-noise amplification of the RF signal from the feedhorn prior to mixing. Thus, the number of components in the down-converter is reduced over the prior art and, therefore, the complexity and cost of manufacturing is also reduced. Such a design therefore also inherently improves the manufacturing yield since there are less low-noise amplifiers per receiver (for the same amount of RF conversion gain) which have the potential to become defective. As such, the low noise block down-converter of the present invention provides high performance for low cost.

Figure 3:
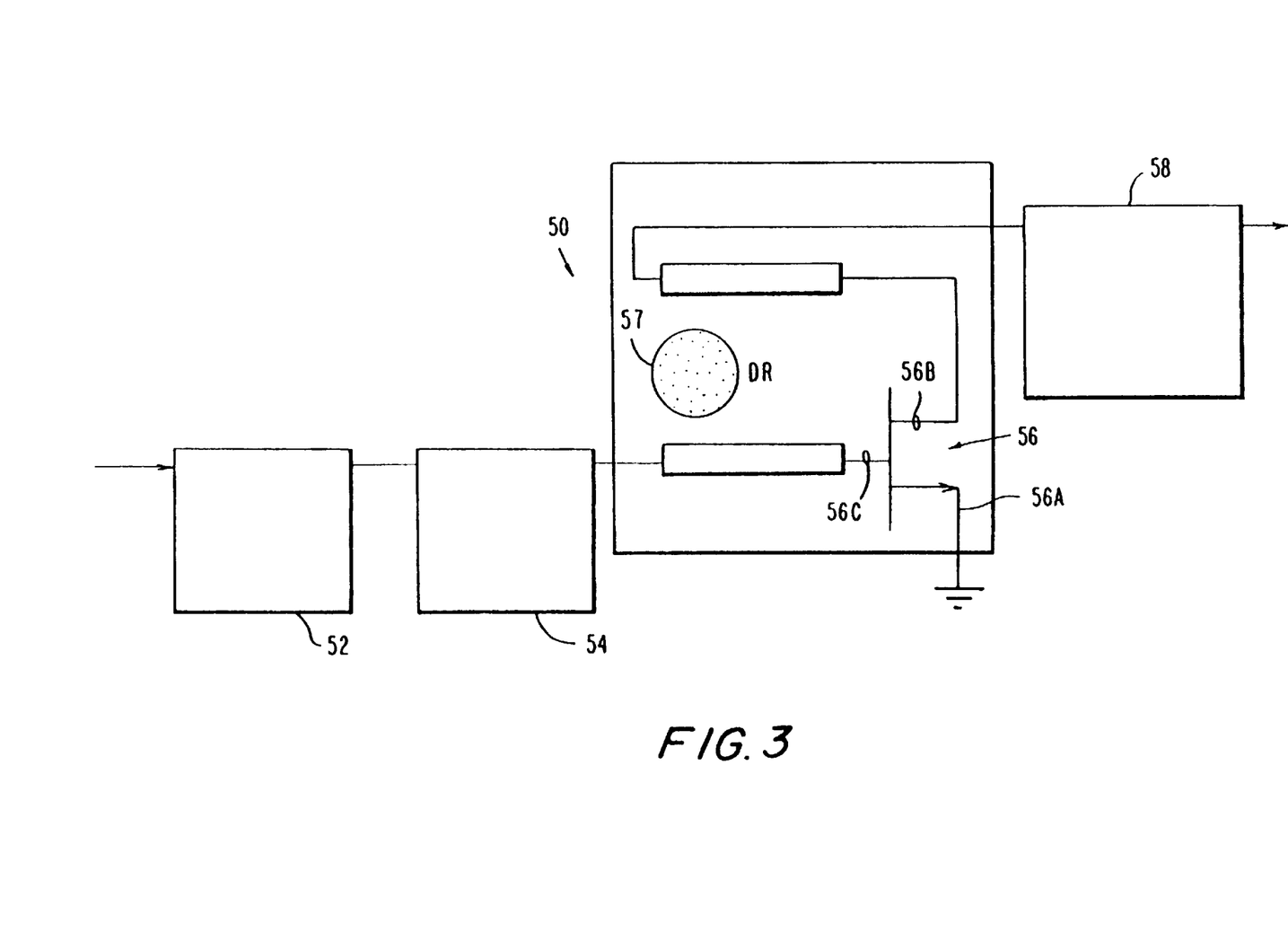
FIG. 3 is a schematic block diagram of an embodiment of a self-oscillating mixer for use in the low-noise block down-converter of the present invention.

FIG. 3 is a schematic block diagram of an embodiment of a self-oscillating mixer 50 for use in the low-noise block down-converter of the present invention. Self-oscillating mixer 50 includes bandpass filter 52, RF matching network 54, GaAs-based MESFET 56, dielectric resonator (DR) 57 and IF matching network 58. Mixer 50 works as follows. MESFET 56 is configured having a common source 56A with parallel feedback from drain 56B to gate 56C to provide the necessary oscillation conditions at drain 56B and gate 56C. The feedback path is made possible by coupling through DR 57, preferably having a relative permitivity and Q-factor greater than about 45 and 4,500, respectively. (Thus, the DR can be modeled as an RLC parallel resonant circuit with transformer coupling to the MESFET gate and drains.) The common source configuration of FIG. 3 is chosen because oscillator 50 would function similar to a MESFET mixer with conversion gain when an RF signal is injected into gate 56C and an IF signal is extracted from drain 56B—except, however, there is no external and independent local oscillator (LO) required and, furthermore, the LO frequency and non-linear frequency mixing are all generated by the MESFET without the need for extra components. In accordance with the present invention, the DR not only determines the oscillation frequency, but also stabilizes it as well against temperature variation.

Bandpass filter 52 is designed and inserted between the two-stage low noise RF amplifier (32/34; FIG. 2) and the MESFET (of the self-oscillating mixer) to reject the image frequency associated with the low noise RF amplifier. RF matching network 54 is designed to match MESFET 56 to the RF amplifier (32/34). Generally, RF matching network 54 and bandpass filter 52 are designed to reduce the effect of RF matching on the oscillation conditions of the self-oscillating mixer.

Figure 4:
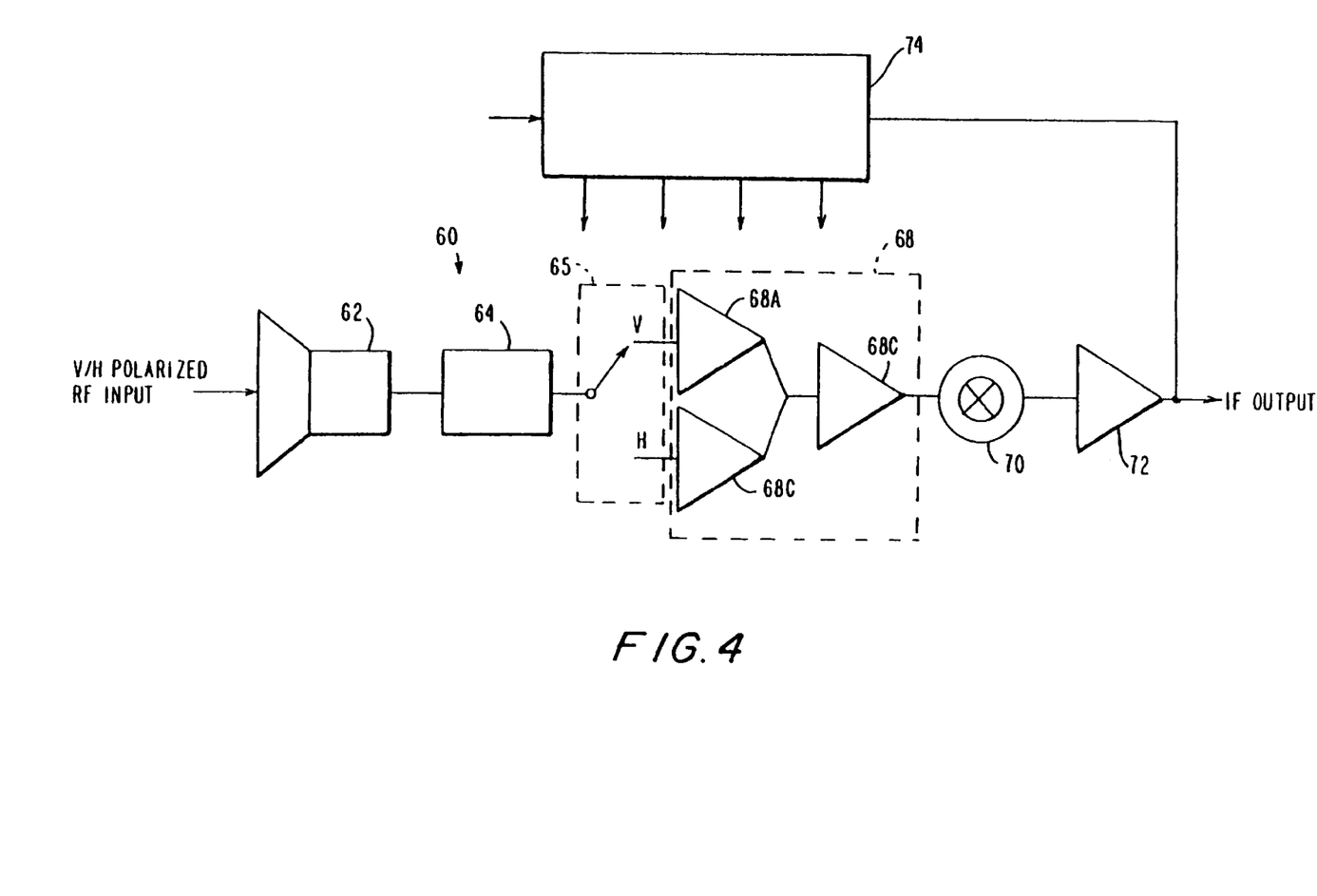
FIG. 4 is a schematic block diagram of a dual-polarity low noise block down-converter with an integrated feedhorn and employing the self-oscillating mixer of the present invention.

FIG. 4 is a schematic block diagram of a dual-polarity low noise block down-converter 60 with an integrated feedhorn and employing the self-oscillating mixer of the present invention. Down-converter 60 includes circular waveguide feedhorn 62, waveguide-to-microstrip transition 64, switch 65, two-stage low noise amplifier 68, self-oscillating mixer 70, IF amplifier 72 and control circuit 74. Down-converter 60 works as follows.

Circular waveguide feedhorn 62 is positioned at the focal point of a satellite reflector dish for collection of an RF signal having both vertical and horizontal polarizations. Waveguide-to-microstrip line transition 64 couples the RF signal to the microstrip line circuit. Switch 65, which is controlled by control circuit 74, is used to selectively couple either the vertical polarization or the horizontal polarization of the RF signal to low noise amplifier 68. If the vertical polarization is selected, the RF signal is coupled first through first-stage amplifier 68A and then through second-stage amplifier 68B. In the alternative, if the horizontal polarization is selected, the RF signal is coupled first through first-stage amplifier 68C and then through second-stage amplifier 68B. The amplified RF signal is then coupled to self-oscillating mixer 70 and then to IF amplifier 72, as discussed above with respect to FIGS. 2 and 3. Control circuit 74 can also provide biasing circuitry for the down-converter if an independent circuit for such purpose is not desired. Of course, although switch 65 is shown as being independent from the other circuitry in FIG. 4, this does not have to be the case. For example, the function of switch 65 could just as well be provided by the internal circuitry of amplifiers 68A and 68C without the need for a separate and independent switch 65.

Thus, FIG. 4 illustrates a dual-polarity low noise block down-converter with an integrated feedhorn and self-oscillating mixer capable of selectively converting either the horizontal or vertical polarization of an RF signal. Because of its use of the self-oscillating mixer of the present invention, the down-converter of FIG. 4 can be made at low cost in comparison to other prior art designs.

Figure 5A:
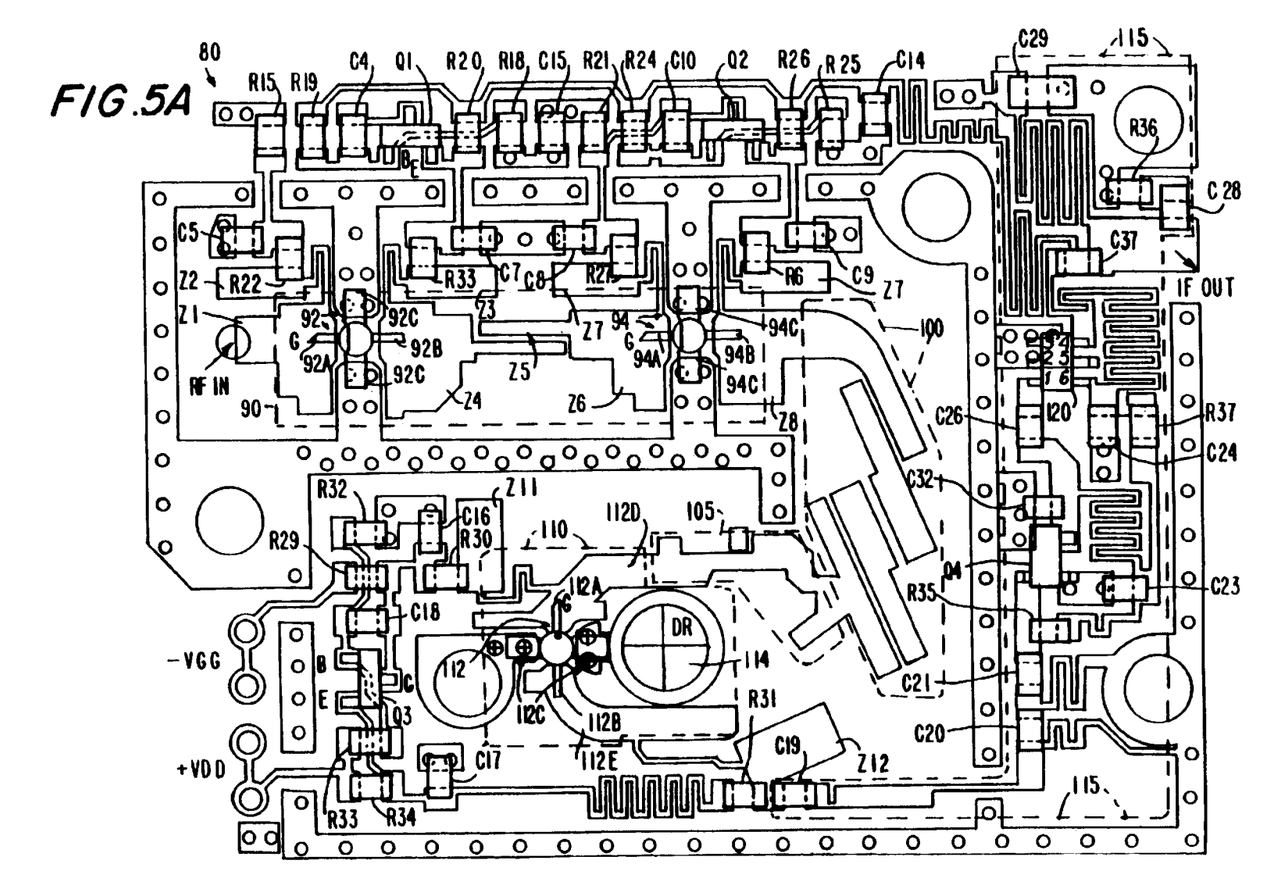
FIG. 5A is a circuit layout of a preferred embodiment of the low noise block down-converter of the present invention for use in an X-band satellite receiver operating at an RF frequency of 10.7 to 11.8 GHz and an IF frequency of 950 to 2,050 MHz.
Figure 5B:
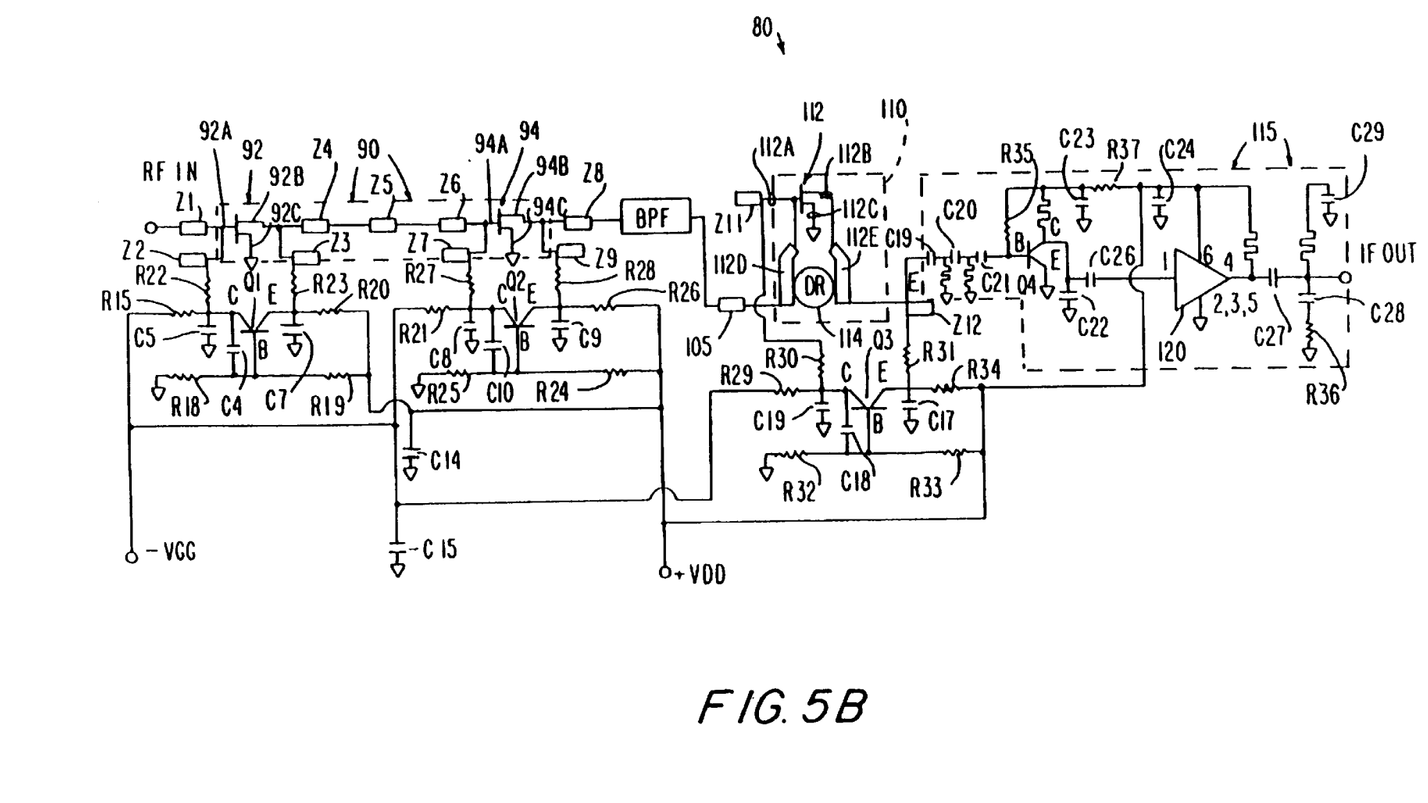
FIG. 5B is a schematic diagram of the equivalent circuit of the low noise block down-converter of FIG. 5A.

FIG. 5A is a circuit layout of a preferred embodiment of the low noise block down-converter of the present invention for use in an X-band satellite receiver operating at an RF frequency of 10.7 to 11.8 GHz and an IF frequency of 950 to 2050 MHz. FIG. 5B is a schematic diagram of the equivalent circuit of the down-converter of FIG. 5A. As shown in FIGS. 5A and 5B, down-converter 80 includes two-stage HEMT RF amplifier 90, bandpass filter 100, RF matching network 105 and self-oscillating mixer 110. HEMT RF amplifier 90 includes two cascaded HEMTs 92 and 94 having gates 92A and 94A, drains 92B and 94B and sources 92C and 94C coupled to ground 99, respectively. Amplifier 90 accepts an RF signal input at gate 92A of HEMT 92 and provides an amplified RF output signal at drain 94B of HEMT 94. The amplified RF signal is then coupled through bandpass filter 100 (preferably, edge-coupled) and then through RF matching network 105 before coupling into self-oscillating mixer 110. Self-oscillating mixer 110 includes MESFET 112 having gate 112A coupled to the output of RF matching network 105 and drain 112B coupled to IF amplifier 115 for amplification of the IF signal provided by mixer 110. Drain 112B of MESFET 112 is coupled to gate 112A through DR 114 for providing self-oscillation. IF amplifier 115 includes NPN bipolar transistor Q4 and integrated circuit amplifier 120 (for example, NEC $\mu$PC 2709: bipolar amplifier IC). In FIGS. 5A and 5B, impedances labeled with a prefix "Z" (e.g., Z1, Z2 and Z3) are impedance matching circuits. Transistors Q1, Q2 and Q3 are PNP bipolar transistors used for biasing transistors 92, 94 and 112, respectively.

Down-converter 80 is preferably designed as follows. First, self-oscillating mixer 110 is designed to oscillate at the selected local oscillation frequency (e.g., 10.75 GHz for operation of the down-converter at 11.7 to 12.2 GHz). This is accomplished by biasing MESFET 112 at the point of minimum noise and empirically inserting DR 114 between gate transmission line 112D and drain transmission line 112E so that the total electrical length of the oscillator is about a multiple of one wave length (i.e., a multiple of $2\pi$) at the local oscillation frequency. Thus, the preferable position for the DR and the spacing between transmission lines 112D and 112E are empirically determined to provide proper feedback and, thus, oscillation. After the self-oscillating mixer is designed, bandpass filter 100 is designed to reject the image frequency associated with two-stage amplifier 90. Next, RF matching network 105 is designed to minimize reflection of the RF signal as it is coupled from bandpass filter 100 to gate 112A of self-oscillating mixer 110. In doing so, the impedance of self-oscillating mixer 110 is first experimentally measured on the gate side so as to assist in a first approximation of the design of RF matching network 105; then, the matching network design is optimized by experimentally monitoring the oscillation of mixer 110 (during RF signal injection) while adjusting the matching network to maintain self-oscillation while minimizing reflection of the RF signal from the mixer. After the matching network is designed, the two-stage HEMT RF amplifier 90 is designed (preferably using a modeling program such as EEsof Touchtone™ or some other similar microwave-design assistance tool) to operate at the point of minimum noise figure.

Thus, the above (in connection with FIGS. 5A and 5B) describes and illustrates the design and fabrication of a particular embodiment of a low-noise block down-converter for use in an X-band satellite receiver system. If desired, the complete down-converter can be fabricated on a single 0.8 mm-thick PTFE laminate substrate, thus resulting in a microwave integrated circuit (MIC). When 0.35 micron-gate HEMTs (having $F_{min}$'s of about 1.0 dB and $G_a$'s of about 10.5 dB at 11 GHz and drain currents of 10 mA) are used in the two-stage RF amplifier using substantially the particular layout of FIG. 5A, the following circuit characteristics have been achieved. With respect to the overall down-converter over the RF operating frequency range of 10.7 to 11.8 GHz: a maximum noise figure of 1.2 dB and a minimum conversion gain of 53 dB. With respect to the self-oscillating mixer: a local oscillation frequency of 9.75 GHz; phase noise of about −106/Hz dBc at 100 KHz away from the carrier; temperature stability of 1.8 ppm per ° C. from −40 to 70° C.; minimum conversion gain of 4 dB; and maximum single side-band noise figure of 3.3 dB over the RF operating frequency of 10.7 to 11.8 GHz. The self-oscillating mixer and the bandpass filter together provide an image rejection of over 52 dB. These characteristics are comparable to conventional prior art down-converters with HEMTs for the RF amplifier (FIG. 1) even though the prior art design has an extra stage of RF amplification and an independent and external local oscillator compared to the design of FIGS. 5A and 5B. Moreover, because the number of components is reduced in the down-converter of FIGS. 5A and 5B compared to the prior art, the power consumption of the circuit is also reduced. For example, a prior art down-converter corresponding to the design in FIGS. 5A and 5B can consume about 120 mA of current, whereas the reduced-component design of FIGS. 5A and 5B can consume as low as 90 mA.

In light of the above, the present invention also includes a method for manufacturing a low noise block down-converter with a reduced number of circuit components for reducing manufacturing cost and improving manufacturing yield and reliability. The method includes the steps of: (a) providing an RF amplifier for amplifying the RF satellite signal; (b) coupling a self-oscillating mixer to the RF amplifier for downconverting the RF satellite signal to an IF signal, where the self-oscillating mixer functions as both an oscillator and mixer; and (c) providing an IF amplifier for amplifying the IF signal.

Although step (a) has been discussed above with respect to a two-stage amplifier for the preferred embodiment of the present invention, if it is desired, additional stages can be employed if additional conversion gain is preferred for particular applications. For example, although FIGS. 5A and 5B illustrate an embodiment of a down-converter for X-band applications where about 53 dB of conversion gain can be achieved using a pair of HEMTs (which is adequate for its intended application), if a larger amount of conversion gain is desired for other applications, additional stages of amplification can be provided as well.

Moreover, although FIGS. 5A and 5B illustrate an embodiment of the down-converter of the present invention for X-band use in the frequency range of 10.7 to 11.8 GHz, the principles of the present invention can also be used to provide a down-converter at other frequencies as well. For example, down-converters for use in frequency ranges of about 12 to 18 GHz (Ku band) and/or about 22.5 to 23.0 GHz can be made by employing transistors (preferably, III–V compound semiconductor-based HEMTs and MESFETs) adapted to operate in the appropriate frequency range.

Figure 6A:
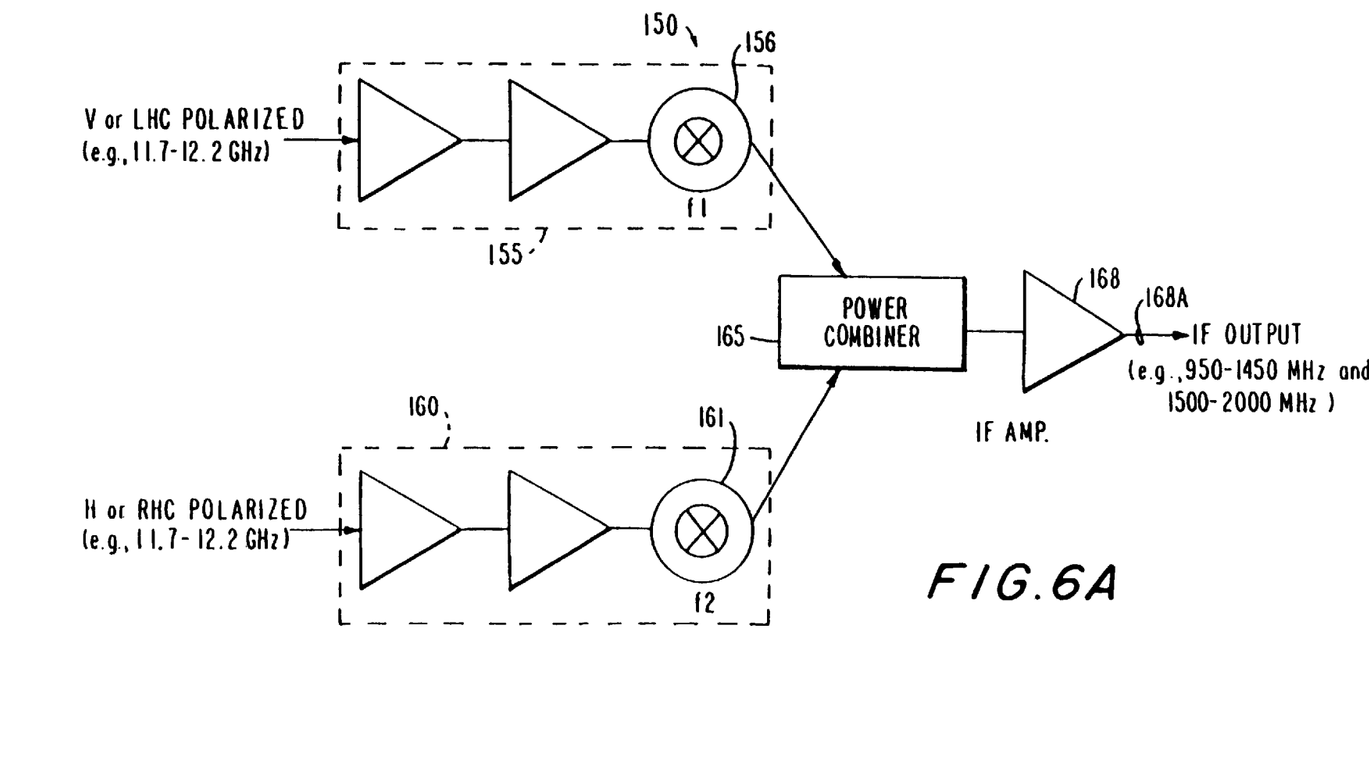
FIG. 6A is a schematic block diagram of a composite-band low noise block down-converter with a pair of self-oscillating mixers in accordance with the present invention.
Figure 6B:
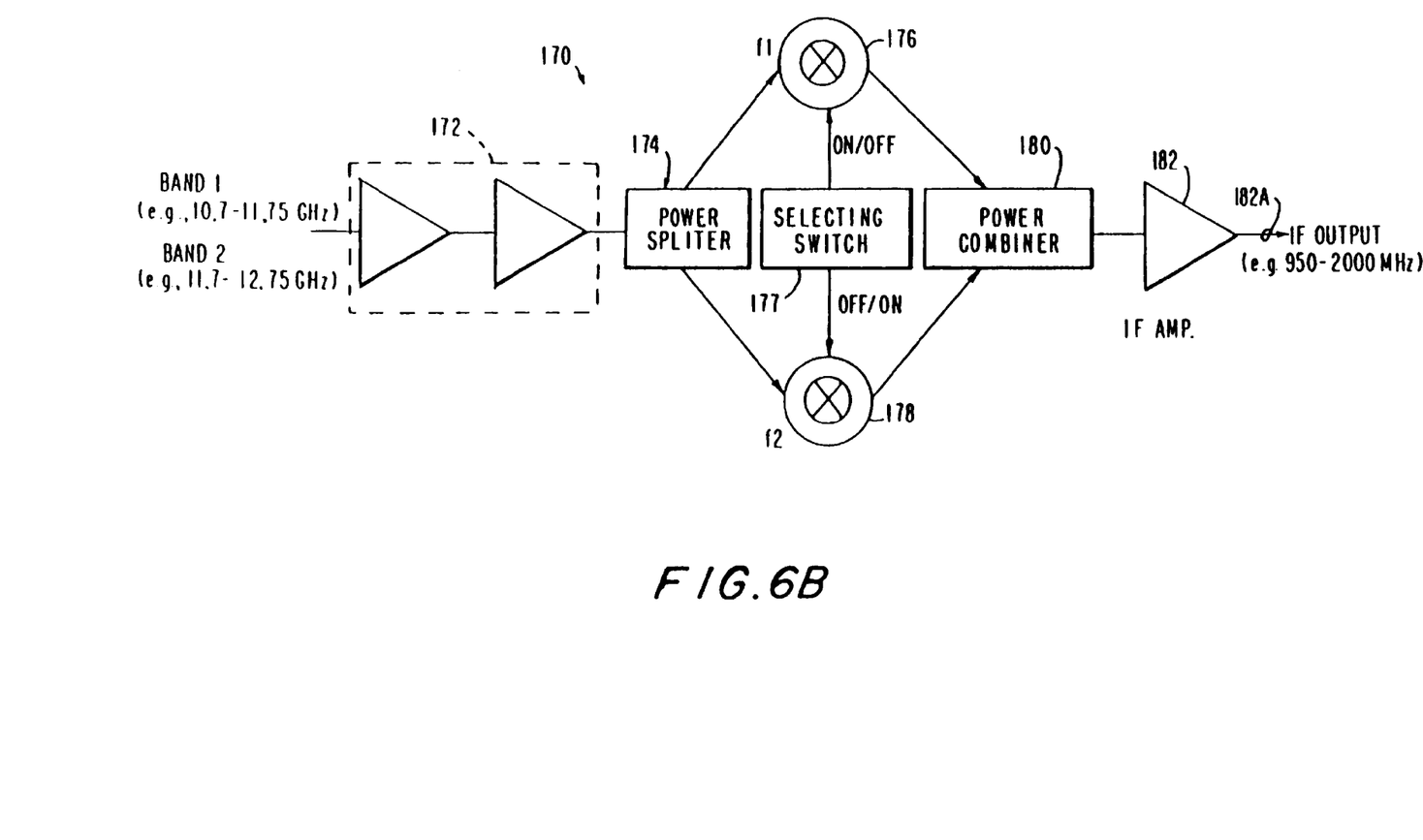
FIG. 6B is a schematic block diagram of a multi-band low noise block down-converter with a pair of self-oscillating mixers in accordance with the present invention.

Thus, FIGS. 2–5 above illustrate various embodiments of the down-converter of the present invention including a single self-oscillating mixer. The present invention also includes down-converters employing a pair or more of self-oscillating mixers made in accordance with the present invention. FIGS. 6A and 6B discussed below are two examples of such down-converters.

FIG. 6A is a schematic block diagram of a composite-band low noise block down-converter 150 with a pair of self-oscillating mixers in accordance with the present invention. Down-converter 150 includes first down-converter 155 and second down-converter 160, power combiner 165 and IF amplifier 168. Down-converter 150 works as follows.

First down-converter 155 is adapted to receive a vertically-polarized (or lefthand circularly-polarized) RF signal while second down-converter 160 is adapted to receive a horizontally-polarized (or righthand circularly-polarized) RF signal. First down-converter 155 includes first self-oscillating mixer 156 operating at a first local oscillation frequency f1 (e.g., 10.75 GHz) while second down-converter 160 includes second self-oscillating mixer 161 operating at a second local oscillation frequency f2 (e.g., 10.2 GHz). Because f1 is chosen to be different than f2, the V and H-polarized RF signals are down converted to different IF bands (e.g., 950–1450 MHz and 1500–2000 MHz, respectively). Power combiner 165 is used to combine the down-converted signals from mixers 156 and 161 to provide a combined signal which is coupled to IF amplifier 168. The amplified IF signal at output 168A is then coupled to a receiver (not shown) with enough bandwidth (e.g., 950–200 MHz) to pick up two bands directly.

Thus, in contrast to the dual-polarity low noise block down-converter illustrated in FIG. 4, wherein the vertical or horizontal RF signal is selected one at a time by a switch, the composite-band down-converter illustrated in FIG. 6A receives the vertical and horizontal RF signals simultaneously by employing a pair of self-oscillating mixers with two different local oscillation frequencies f1 and f2 so that the vertical and horizontal RF signals are down converted simultaneously to different IF bands. This allows both polarizations of the RF signal from the satellite dish to be demodulated/viewed simultaneously if desired.

FIG. 6B is a schematic block diagram of a multi-band low noise block down-converter 170 with a pair of self-oscillating mixers in accordance with the present invention. Down-converter 170 includes low noise RF amplifier 172, power spliter 174, first self-oscillating mixer 176, second self-oscillating mixer 178, power combiner 180 and IF amplifier 182. Down-converter 170 works as follows.

Low noise RF amplifier 172 is adapted to receive a pair of RF signals in a first and second frequency band, respectively (e.g., 10.7 to 11.75 GHz and 11.7 to 12.75 GHz, respectively). The amplified RF signal is then split by power spliter 174. Switch 177 is used to selectively choose either first self-oscillating mixer 176 (having a first local oscillation frequency f1, e.g., 9.75 GHz) or second self-oscillating mixer 178 (having a second local oscillation frequency f2, e.g., 10.75 GHz) for down conversion to the same IF range. The down converted IF signals are then coupled to power combiner 180 and, subsequently, to IF amplifier 182. The amplified IF signal at output 182A is then coupled to a receiver (not shown) with enough bandwidth (e.g., 950–2000 MHz) to pick up the signal.

Thus, the multi-band down-converter of FIG. 6B includes a pair of self-oscillating mixers wherein either the first or second self-oscillating mixer of the present invention is turned ON to select a first band or a second band of RF signal, respectively, to be converted down to the same IF range. This allows a single down-converter to be used to down convert a selected RF signal from a plurality of frequency bands.

Although the self-oscillating mixer of the present invention has been discussed above with reference to the FIGURES wherein the mixer transistor employed was generally referred to as a single-gate MESFET, this does not have to be the case. For example, other types of transistors can be employed as well (e.g., dual-gate MESFETs or single/dual-gate HEMTs) as long as such transistors are capable of providing stable self-oscillation so as to be able to function as both an oscillator and a mixer.

Additionally, although the down-converter of the present invention has been discussed above with reference to the FIGURES wherein the down-converter is illustrated as being composed of discrete circuits which are interconnected, this does not have to be the case. For example, the complete down-converter of the present invention, or a part thereof (e.g., only a self-oscillator and an IF amplifier), could just as well be fabricated on a single semiconductor substrate to provide a monolithic microwave integrated circuit (MMIC), if desired.

Thus, a low-cost, low noise block down-converter for use in a satellite broadcasting receiver has been provided. One skilled in the art will appreciate that the present invention can be practiced by other than the described embodiments, which are presented here for purposes of illustration and not of limitation, and that the present invention is limited only by the claims it follows.

What is claimed is:

1. A low noise block down-converter for use in a receiver in a satellite broadcasting system comprising:

a first low noise amplifier having an input adapted for coupling to a first RF signal from a satellite reflector dish and having an output for providing an amplified first RF signal; and a first self-oscillating mixer having an input coupled to the amplified first RF signal and having an output for providing a first intermediate frequency signal corresponding to the first RF signal, wherein the first self-oscillating mixer functions as both an oscillator and a mixer, wherein said mixer includes a single-gate transistor stabilized with a resonator that provides conversion gain so as to reduce the number of stages of amplification required in the low noise amplifier and wherein the resonator is whereby the down-converter converts the first RF signal to the first intermediate frequency signal at a lower frequency with a reduced number of components and simpler circuit design.

2. The down-converter of claim 1, wherein resonator is coupled between the drain and gate of the transistor to provide feedback therebetween.

3. The down-converter of claim 2, wherein the transistor is a MESFET.

4. The down-converter of claim 3, wherein the MESFET is configured in a common-source configuration.

5. The down-converter of claim 4, wherein the first self-oscillating mixer is adapted to operate with conversion gain.

6. The down-converter of claim 5, wherein the first self-oscillating mixer includes an RF matching network at its input for providing impedance matching between said first low noise amplifier and the first self-oscillating mixer.

7. The down-converter of claim 1, further including an intermediate frequency amplifier having an input adapted for coupling to the intermediate frequency signal to provide an amplified first intermediate frequency signal.

8. The down-converter of claim 7, wherein the first self-oscillating mixer includes an intermediate frequency matching network at its output for providing impedance matching to said intermediate frequency amplifier.

9. The down-converter of claim 1, wherein the first low noise amplifier comprises a two-stage amplifier.

10. The down-converter of claim 9, wherein the two-stage amplifier includes two cascaded high electron mobility transistors.

11. The down-converter of claim 1, wherein the first self-oscillating mixer includes a high electron mobility transistor and a resonator coupled between the drain and gate of the transistor to provide feedback therebetween.

12. The down-converter of claim 1 further comprising: (1) a second low noise amplifier having an input adapted for coupling to a second RF signal and having an output for providing an amplified second RF signal and (2) a second self-oscillating mixer having an input coupled to the amplified second RF signal and having an output for providing a second intermediate frequency signal corresponding to the second RF signal, wherein the first and second intermediate frequency signals are in different frequency bands and are combined with a power combiner to provide an intermediate frequency output signal having a pair of signals in respective intermediate frequency bands, whereby the down-converter is capable of receiving a pair of RF frequency signals for simultaneous down conversion to two different intermediate frequency bands.

13. The down-converter of claim 12 wherein the first RF signal has a different polarization than the second RF signal.

14. The down-converter of claim 1 further comprising: (1) a second self-oscillating mixer having an input also coupled to the amplified first RF signal and having an output for providing a second intermediate frequency signal, wherein the first and second intermediate frequency signals are in different frequency bands and are combined with a power combiner to provide an intermediate frequency output, whereby the down-converter is capable of receiving an RF frequency signal in a pair of RF frequency bands for selective down conversion to an intermediate frequency.

15. The down-converter of claim 14 further including a switching means for selecting down conversion of one of the two RF frequency bands.

16. A low noise block down-converter for use in a receiver in a direct broadcasting satellite system comprising:
a low noise amplifier having an input adapted for coupling to a RF signal from a satellite reflector dish and having an output for providing an amplified RF signal, wherein the RF signal is in the frequency range of either about 10 to about 12 GHz or about 12 to about 18 GHz; and
a self-oscillating mixer having an input coupled to the amplified RF signal and having an output for providing an intermediate frequency signal corresponding to the RE signal, wherein the self-oscillating mixer functions as both an oscillator and a mixer, wherein said mixer includes a single-gate transistor stabilized with a resonator that provides conversion gain so as to reduce the number of stages of amplification required in the low noise amplifier and wherein the resonator is coupled between the mixer output and mixer input providing feedback therebetween;
whereby the down-convener converts the RF signal to the intermediate frequency signal at a lower frequency with a reduced number of components and simpler circuit design.

17. The down-converter of claim 16, wherein the self-oscillating mixer includes a MESFET and the resonator is coupled between the drain and gate of the MESFET to provide feedback therebetween.

18. The down-converter of claim 16, wherein the self-oscillating mixer is adapted to operate with conversion gain.

19. The down-converter of claim 16, wherein the self-oscillating mixer includes an RF matching network at its input for providing impedance matching between said RF amplifier and the self-oscillating mixer.

20. The down-converter of claim 16, further including an intermediate frequency amplifier having an input adapted for coupling to the intermediate frequency signal to provide an amplified intermediate frequency signal.

21. The down-converter of claim 16, wherein the down-converter provides a maximum noise figure of less than about 1.2 dB and a minimum conversion gain of greater than about 50 dB over the operating frequency range of about 10 to about 12 GHz.

22. The down-converter of claim 16, wherein the low noise amplifier is a two-stage amplifier including two high electron mobility transistors.

23. The down-converter of claim 16, wherein the self-oscillating mixer includes a high electron mobility transistor and the resonator is coupled between the drain and gate of the high electron mobility transistor to provide feedback therebetween.

24. The down-converter of claim 16, wherein the RF signal is a RF signal in the frequency range of about 10 to about 12 GHz.

25. A dual-polarity low noise block down-converter for use in a receiver in a satellite broadcasting system comprising:
a feedhorn adapted to be positioned at a focal point of a satellite for receiving an RF signal having both vertical and horizontal polarizations;
a waveguide to microstrip transition for coupling the RF signal from the feedhorn to a microstrip circuit;
a switch mounted on the microstrip circuit for selectively coupling either the vertical or horizontal polarization of the RF signal to be amplified and down-converted;
a low noise amplifier mounted on the microstrip circuit having an input coupled to the switch for receiving the selected polarization of the RF signal and having an output for providing an amplified RF signal; and
a self-oscillating mixer having an input coupled to the amplified RF signal and having an output for providing an intermediate frequency signal corresponding to the RF signal, wherein the self-oscillating mixer functions as both an oscillator and a mixer, wherein said mixer includes a single-gate transistor stabilized with a resonator that provides conversion gain so as to reduce the number of stages of amplification required in the low noise amplifier and wherein the resonator is coupled between the mixer output and mixer input providing feedback therebetween;
whereby the down-converter converts the RF signal to the intermediate frequency signal at a lower frequency with a reduced number of components and simpler circuit design.

26. The down-converter of claim 25, wherein the resonator is coupled between the drain and gate of the transistor to provide feedback therebetween.

27. The down-converter of claim 26, wherein the transistor is a MESFET and the dielectric resonator provides feedback from the drain to the gate of the MESFET.

28. The down-converter of claim 27, wherein the MESFET is configured in a common-source configuration.

29. The down-converter of claim 28, wherein the self-oscillating mixer is adapted to operate with conversion gain.

30. The down-converter of claim 29, wherein the self-oscillating mixer includes an RF matching network at its input for providing impedance matching between said RF amplifier and the self-oscillating mixer.

31. The down-converter of claim 25, further including an intermediate frequency amplifier having an input adapted for coupling to the intermediate frequency signal to provide an amplified intermediate frequency signal.

32. The down-converter of claim 31, wherein the self-oscillating mixer includes an intermediate frequency matching network at its output for providing impedance matching to said intermediate frequency amplifier.

33. The down-converter of claim 25, wherein the low noise amplifier comprises a two-stage amplifier.

34. The down-converter of claim 33, wherein the two-stage amplifier includes two cascaded high electron mobility transistors.

35. The down-converter of claim 25, wherein the self-oscillating mixer includes a high electron mobility transistor and the resonator is coupled between the drain and gate of the high electron mobility transistor to provide feedback therebetween.

36. A method for manufacturing a low noise block down-converter for use in a receiver in a satellite broadcasting system, the method comprising the steps of:

(a) providing an RF amplifier for amplifying an RF satellite signal;

(b) coupling a self-oscillating mixer to the RF amplifier for downconverting the RF satellite signal to an intermediate frequency, wherein the self-oscillating mixer functions as both an oscillator and mixer, wherein said mixer includes a single-gate transistor stabilized with a resonator that provides conversion gain so as to reduce the number of stages of amplification required in the low noise amplifier; and wherein the resonator is coupled between an output of the mixer and the input of the mixer providing feedback therebetween (c) providing an intermediate frequency amplifier for amplifying the intermediate frequency signal;

whereby the down-converter converts the RF signal to the intermediate frequency signal at a lower frequency with a reduced number of components and simpler circuit design.

37. The method of claim 36, wherein the resonator is coupled between the drain and gate of the transistor to provide feedback therebetween.

38. The method of claim 36, wherein the transistor is a MESFET.

39. The method of claim 38, wherein the MESFET is configured in a common-source configuration.

40. The method of claim 38, wherein the self-oscillating mixer is adapted to operate with conversion gain.

41. The method of claim 39, wherein the self-oscillating mixer includes an RF matching network at its input for providing impedance matching between said RF amplifier and the self-oscillating mixer.

42. The method of claim 36, further including the step of providing an intermediate frequency amplifier having an input adapted for coupling to the intermediate frequency signal to provide an amplified intermediate frequency signal.

43. The method of claim 42, wherein the self-oscillating mixer includes an intermediate frequency matching network at its output for providing impedance matching to said intermediate frequency amplifier.

44. The method of claim 36, wherein the low noise amplifier comprises a two-stage amplifier.

45. The method of claim 44, wherein the two-stage amplifier includes two cascaded high electron mobility transistors.

46. The method of claim 36, wherein the self-oscillating mixer includes a high electron mobility transistor and the resonator is coupled between the drain and gate of the high electron mobility transistor to provide feedback therebetween.

* * * * *